(12) United States Patent
Yun

(10) Patent No.: US 7,829,968 B2
(45) Date of Patent: Nov. 9, 2010

(54) PLANAR LAYER OF IMAGE SENSOR, METHOD FOR MANUFACTURING PLANER LAYER, AND IMAGE SENSOR INCLUDING PLANAR LAYER

(75) Inventor: Young-Je Yun, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 432 days.

(21) Appl. No.: 11/847,605

(22) Filed: Aug. 30, 2007

(65) Prior Publication Data

US 2008/0054389 A1 Mar. 6, 2008

(30) Foreign Application Priority Data

Aug. 31, 2006 (KR) ...................... 10-2006-0083345

(51) Int. Cl.
*H01L 31/0216* (2006.01)
(52) U.S. Cl. ................................ 257/436; 257/E31.121
(58) Field of Classification Search ................ 257/432, 257/436, E31.121
See application file for complete search history.

(56) References Cited

U.S. PATENT DOCUMENTS

| | | | |
|---|---|---|---|
| 6,639,726 B1* | 10/2003 | Campbell | 359/619 |
| 7,384,813 B2* | 6/2008 | Kim | 438/70 |
| 2002/0058350 A1* | 5/2002 | Kim | 438/29 |
| 2004/0147059 A1* | 7/2004 | Jeong et al. | 438/70 |
| 2006/0145218 A1* | 7/2006 | Hwang | 438/70 |
| 2009/0152660 A1* | 6/2009 | Park | 257/432 |

FOREIGN PATENT DOCUMENTS

| | | |
|---|---|---|
| JP | 2006-053458 | 2/1994 |
| KR | 1020000044589 A | 7/2000 |

\* cited by examiner

*Primary Examiner*—Lynne A Gurley
*Assistant Examiner*—Colleen A Matthews
(74) *Attorney, Agent, or Firm*—Sherr & Vaugh, PLLC

(57) ABSTRACT

An image sensor formed using a method for manufacturing a planar layer in a process for forming microlenses may be used in a complementary metal oxide semiconductor (CMOS) image sensor. Embodiments provide a planar layer that can improve the operation performance of an image sensor, a manufacturing method thereof, and the image sensor including the planar layer. Embodiments relate to a planar layer located under microlenses, the planar layer including valleys of patterns having a predetermined size, which may eliminate optical cross talk between adjacent pixels.

9 Claims, 3 Drawing Sheets though the gap is very difficult to control. Light travelling through the gaps may erroneously propagate to adjacent pixels of the color filter layer 90 as illustrated.

PLANAR LAYER OF IMAGE SENSOR, METHOD FOR MANUFACTURING PLANER LAYER, AND IMAGE SENSOR INCLUDING PLANAR LAYER

The present application claims priority under 35 U.S.C. 119 to Korean Patent Application No. 10-2006-0073345 (filed on Aug. 31, 2006), which is hereby incorporated by reference in its entirety.

BACKGROUND

The process of forming microlenses may be one of the most important processes influencing the performance of an image sensor. During the process for forming microlenses, gaps between the microlenses are very difficult to remove when lens patterns are formed using photolithography. It is very difficult to control the direction of light signals delivered to a lower layer through the gaps. When light passes through gaps to a lower photodiode layer, it may strike adjacent pixels, generating cross-talk, which considerably reduces the performance of the image sensor.

FIG. 1 is a view of an image sensor manufactured according to a related art. FIG. 2 is an enlarged view of a microlens unit. FIG. 3 is a view explaining a process for forming microlenses according to a related art. As shown in FIG. 1, a CMOS image sensor includes a photodiode region for receiving light using microlenses, and a logic region allowing signal transfer between layers.

A metal/insulator/metal (MIM) layer including a first metal layer 21, a dielectric layer 22, and a second metal layer 23 are formed in a logic region of a substrate 10. A third meal layer 60 is formed in a photodiode region of the substrate 10. A first interlayer insulating layer 30 is formed over the entire surfaces of the photodiode region and the logic region. The first interlayer insulating layer 30 may be etched to form a predetermined contact hole, and metal may be deposited to form a contact plug 40. A fourth metal layer 50 may be formed over the contact plug 40, so that an upper metal line may be formed by the fourth metal layer 50.

After a second interlayer insulating layer 70 is formed over the entire surfaces of the photodiode region and the logic region, a process for forming microlenses is performed over the photodiode region. After the second interlayer insulating layer 70 is etched to a predetermined thickness, a light receiving portion, that is, a color filter layer 90, a planar layer 91, and a lens layer 92 are formed. In particular, after the color filter layer 90 is formed, the planar layer 91 is formed over the color filter layer 90, and a process for forming the microlenses is invoked. The process for forming the microlenses uses a reflow process using a photoresist formed over the planar layer 91.

FIG. 2 is an enlarged view of the light receiving portion including the color filter layer, the planar layer, and the lens layer. The planar layer 91 is formed over the color filter layer 90 which transmits light having a predetermined wavelength. Microlenses forming the lens layer 92 are formed with a predetermined gap over the planar layer 91. The direction of light delivered to a lower portion through the gap is very difficult to control. Light travelling through the gaps may erroneously propagate to adjacent pixels of the color filter layer 90 as illustrated.

A method for manufacturing the planar layer will be described with reference to FIG. 3. In an image sensor in the related art, open photoresist patterns may be formed on a peripheral circuit region, not a pixel region. A mask with a transparent portion over the pixel region is used to expose the photoresist.

The portion of the photoresist that has received light remains, and a portion of the photoresist that has not received light is removed, so that a planar layer 91 is manufactured as illustrated in FIG. 4. The above-described photoresist is also called a negative photoresist.

As described above, since the microlenses are formed over a planar layer having an upper planar surface. The microlenses are formed with a predetermined gap, so propagating light may deflect to adjacent pixels of the color filter layer, which reduces the operating performance of the image sensor.

SUMMARY

Embodiments relate to an image sensor, and more particularly, to a method for manufacturing a planar layer in a process for forming microlenses of a complementary metal oxide semiconductor (CMOS) image sensor. Embodiments provide a planar layer that can improve the operation performance of an image sensor, a manufacturing method thereof, and the image sensor including the planar layer. Embodiments relate to a planar layer located under microlenses, the planar layer including valleys of patterns having a predetermined size.

In embodiments, a method for manufacturing a planar layer located under microlenses includes exposing a photoresist using a predetermined patterned mask to allow an exposed portion of the photoresist to have planar surfaces, the mask including patterned crossed lines formed with a predetermined gap.

Embodiments relate to an image sensor used for receiving light and converting the light into electrical signals. The image sensor includes a light receiving portion, the light receiving portion includes a color filter layer, a planar layer over the color filter layer, and microlenses over corresponding planar surfaces of the planar layer. The planar layer includes valleys having a predetermined size and planar surfaces between the valleys.

DRAWINGS

Figure 1:
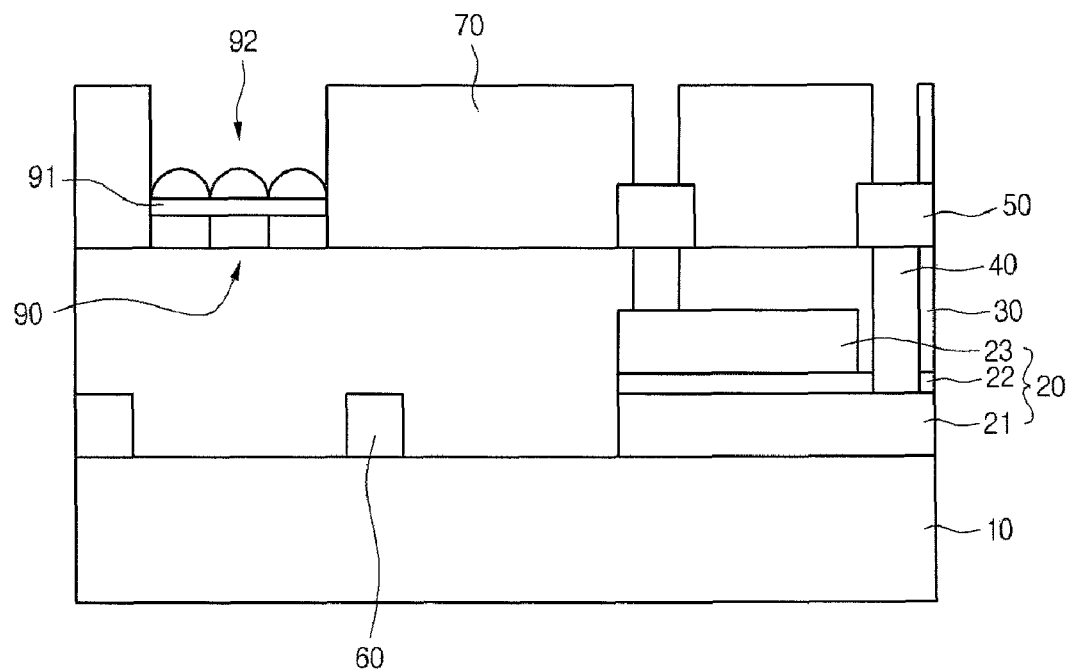
FIG. 1 is a view of an image sensor manufactured according to a related art.
Figure 2:
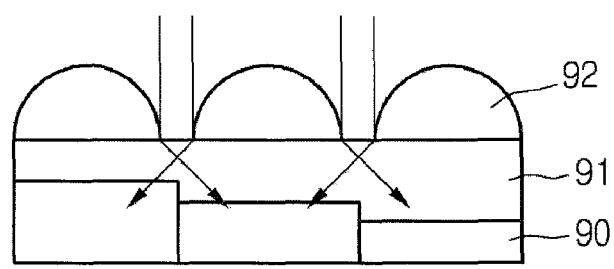
FIG. 2 is an enlarged view of a microlens unit.
Figure 3:
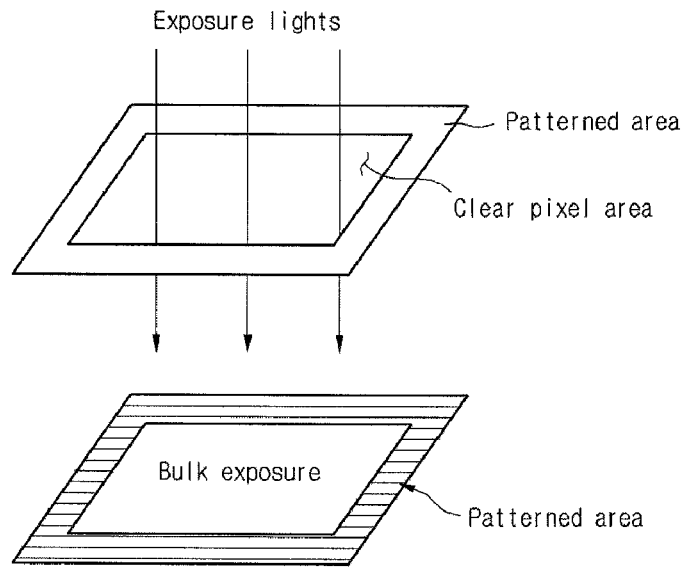
FIG. 3 is a view explaining a process for forming microlenses according to a related art.
Figure 4:
FIG. 4 is a cross-sectional view of a planar layer manufactured according the process of FIG. 3.
Figure 5:
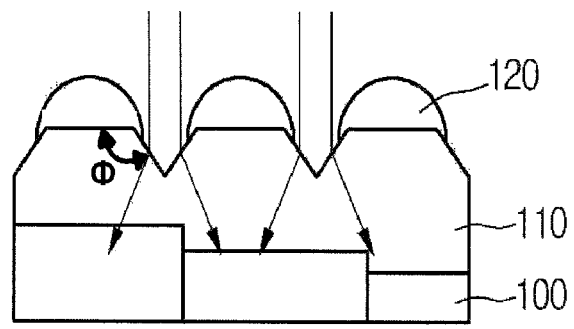

Example FIG. 5 is a view illustrating a light receiving portion manufactured according to embodiments.

Figure 6:
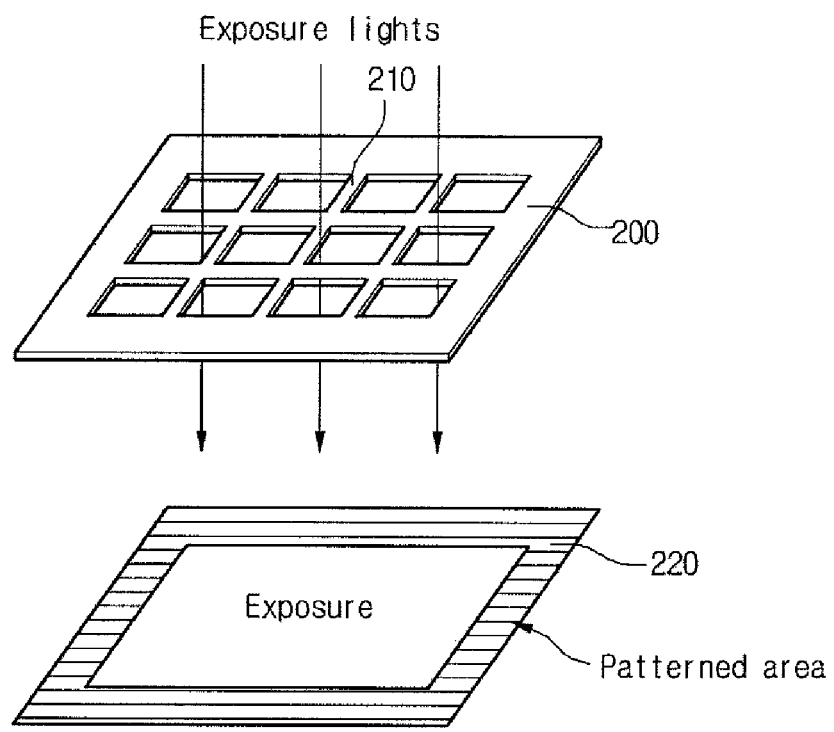

Example FIG. 6 is a view illustrating a method for manufacturing a planar layer according to embodiments.

Figure 7:
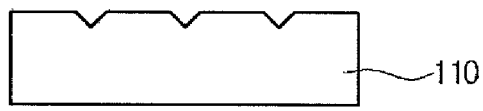

Example FIG. 7 is a cross-sectional view of the planar layer manufactured according to the method of Example FIG. 6.

Figure 8:
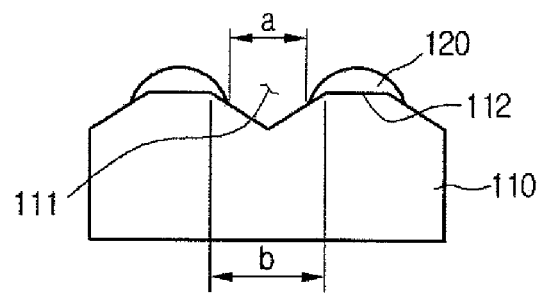

Example FIG. 8 is an enlarged view of a planar layer according to embodiments.

DESCRIPTION

Example FIG. 5 is a view illustrating a light receiving portion manufactured according to embodiments. Referring to example FIG. 5, a light receiving portion for receiving light and delivering the light to a photodiode at a lower layer is illustrated. This includes a color filter layer 100 for receiving light having predetermined wavelengths, a planar layer 110 formed over the color filter layer 100, and microlenses 120 formed over the planar layer 110 to condense light. Planar layer 110 allows light received by the microlenses 120 to be focused and directed to respective pixels of the color filter layer 100. The planar layer 110 according to embodiments also has numerous planar surfaces over which the microlenses are formed.

The planar layer 110 has valleys of a predetermined size in portions between the respective pixels forming the color filter layer 100. The valleys formed in the planar layer 110 focus light that passes through the gaps between the microlenses to prevent the light from erroneously propagating to adjacent pixels of the color filter layer 100. As shown in FIG. 5, each slope of the valleys forms an obtuse angle 'φ' with a respective plane of the planar surfaces on which microlenses 120 are formed. Also, the planar layer 110 is manufactured through a photolithography process using a photoresist. Hereinafter, a method for manufacturing the planar layer 110 will be described in detail.

Example FIG. 6 is a view explaining a method for manufacturing a planar layer according to embodiments. Referring to example FIG. 6, crossed lines 210 are formed in a photolithography mask 200 used for manufacturing the planar layer. The crossed lines 210 prevent light of an exposure process from propagating to a photoresist pattern 220 at a lower portion. The photoresist 220 is designed for manufacturing the above-described planar layer, and designed in advance for regions where the microlenses are to be formed. Therefore, portions of the mask 200 that correspond to positions where the microlenses are to be formed are open, and the crossed lines 210 are formed in portions of the mask 200 that correspond to positions where the valleys are to be formed.

Also, since light does not propagate to the portions of the photoresist 220 through the crossed lines 210 during an exposure process, the corresponding portions of the photoresist 220 are removed. For this purpose, a negative photoresist is used as the photoresist 220. The light does not propagate due to the crossed lines 210, which are formed of Cr. Exposure energy is controlled so that valleys of a predetermined size are formed in the photoresist 220. Controlling exposure energy controls an exposure rate of a photoresist, which ultimately controls the formation of valleys.

A patterned planar layer 110 according to embodiments illustrated in example FIG. 7 is formed by adding patterns blocked by Cr to a pixel area of the mask 200. Example FIG. 8 is an enlarged view of a planar layer according to embodiments. Referring to example FIG. 8, the planar layer 110 including the valleys 111 of the predetermined size are illustrated according to embodiments, and the microlenses 120 formed over planar surfaces 112 of the planar layer 110 are illustrated. The valleys 111 in the planar layer 110 are formed by a photolithography process using the mask including the crossed lines as described above. Particularly, when the microlenses 120 are formed, a reflow process should be performed so that the planar surfaces 112 of the planar layer 110 are not exposed.

Example FIG. 8 illustrates a gap 'b' between the planar surfaces 112 of the planar layer 110, and a gap 'a' between the microlenses 120. The gap 'b' between the planar surfaces 112 of the planar layer 110, and the gap 'a' between the microlenses 120 are designed in consideration of an alignment precision limit 'c' of an exposure apparatus used for the photolithography process for forming the microlenses. Since a related art exposure apparatus has a precision limit 'c' reaching about 100 nm at the maximum, the valleys 111 and the microlenses 120 should be formed accordingly.

Therefore, the gap 'b' between the planar surfaces 112 of the planar layer 110 is made larger than sum of the gap 'a' between the microlenses 120 and the precision limit 'c' of the exposure apparatus. The valleys 111 of the planar layer 110 are manufactured such that b>a+c. The planar surface 112 is not allowed to be exposed by the microlenses 120.

The microlenses and the planar layers manufactured using the above-described method allow light to be focused by the valleys of the planar layer even when the light propagates through the gaps between the microlenses. Accordingly, a phenomenon that light is erroneously deflected to adjacent pixels of the color filter layer is prevented. According to the above-described embodiments, the phenomenon that light is erroneously delivered to adjacent pixels of the color filter layer is prevented, so that operational reliability of the sensor may be maximized.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. An apparatus comprising:
    a plurality of microlenses; and
    a planar layer located under said microlenses, the planar layer comprising valleys of patterns having a predetermined size and planar surfaces on which the microlenses are formed, wherein the valleys are between the planar surfaces,
    wherein a gap 'b' between the planar surfaces of the planar layer is designed such that 'b' is greater than sum of 'a' and 'c', where 'a' is a gap between the microlenses, and 'c' is a precision limit of an exposure apparatus used for forming the planar layer and the microlenses.

2. The apparatus of claim 1, wherein each slope of the valleys forms an obtuse angle 'φ' with a respective plane of the planar surfaces on which the microlenses are formed.

3. The apparatus of claim 1, wherein the valleys focus propagating light.

4. The apparatus of claim 1, comprising a color filter layer.

5. The apparatus of claim 4, wherein the valleys focus propagating light on said color filter layer.

6. An apparatus comprising:
    a light receiving portion in an image sensor comprising:
    a color filter layer;
    a planar layer on the color filter layer, the planar layer comprising valleys having a predetermined size and planar surfaces between the valleys; and
    microlenses on the planar surfaces of the planar layer,
    wherein a gap 'b' between the planar surfaces of the planar layer is designed such that 'b' is greater than sum of 'a' and 'c', where 'a' is a gap between the microlenses, and 'c' is a precision limit of an exposure apparatus used for forming the planar layer and the microlenses.

7. The apparatus of claim 6, wherein the microlenses are formed such that the planar surfaces of the planar layer are not exposed.

8. The apparatus of claim 6, wherein each slope of the valleys forms an obtuse angle 'φ' with a respective plane of the planar surfaces on which the microlenses are formed.

9. The apparatus of claim 6, wherein the valleys focus propagating light on said color filter layer.

* * * * *